United States Patent
Dyer et al.

(10) Patent No.: US 7,550,330 B2
(45) Date of Patent: Jun. 23, 2009

(54) DEEP JUNCTION SOI MOSFET WITH ENHANCED EDGE BODY CONTACTS

(75) Inventors: Thomas W. Dyer, Pleasant Valley, NY (US); Zhijiong Luo, Carmel, NY (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 182 days.

(21) Appl. No.: 11/564,352

(22) Filed: Nov. 29, 2006

(65) Prior Publication Data

US 2008/0121994 A1 May 29, 2008

(51) Int. Cl.
*H01L 21/00* (2006.01)
*H01L 21/84* (2006.01)

(52) U.S. Cl. ............... 438/151; 438/149; 438/479; 257/347; 257/E21.411; 257/E29.273

(58) Field of Classification Search ............ 438/151, 438/479, 149; 257/347, E29.273, E21.411
See application file for complete search history.

(56) References Cited

U.S. PATENT DOCUMENTS

| | | | |
|---|---|---|---|
| 4,700,454 A | 10/1987 | Baerg et al. | |
| 4,717,677 A | 1/1988 | McLaughlin et al. | |
| 4,810,664 A | 3/1989 | Kamins et al. | |
| 5,955,767 A | 9/1999 | Liu et al. | |
| 6,069,054 A | 5/2000 | Choi | |
| 6,204,138 B1 * | 3/2001 | Krishnan et al. | 438/307 |
| 6,294,817 B1 | 9/2001 | Srinivasan et al. | |
| 6,352,903 B1 | 3/2002 | Rovedo et al. | |
| 6,403,482 B1 | 6/2002 | Rovedo et al. | |
| 6,429,091 B1 | 8/2002 | Chen et al. | |
| 6,525,340 B2 | 2/2003 | Colavito et al. | |
| 6,544,874 B2 | 4/2003 | Mandelman et al. | |
| 6,867,106 B2 * | 3/2005 | Yamaguchi et al. | 438/331 |
| 6,884,702 B2 | 4/2005 | Wei et al. | |
| 7,442,586 B2 * | 10/2008 | Dyer et al. | 438/149 |

\* cited by examiner

*Primary Examiner*—Phuc T Dang
(74) *Attorney, Agent, or Firm*—Scully, Scott, Murphy & Presser, P.C.; Joseph P. Abate, Esq.

(57) ABSTRACT

A semiconductor structure is provided that has body contacts that are located at the edges of the device channel and a buried insulating region under the device channel that is shallower than the buried insulating regions under the source/drain junctions. A method of forming such a semiconductor structure is also described. The inventive method provides for self-alignment of the various features mentioned above with the gate conductor of the structure.

10 Claims, 19 Drawing Sheets

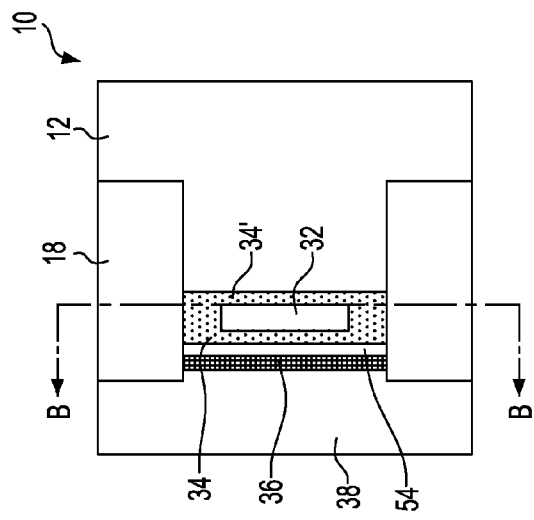
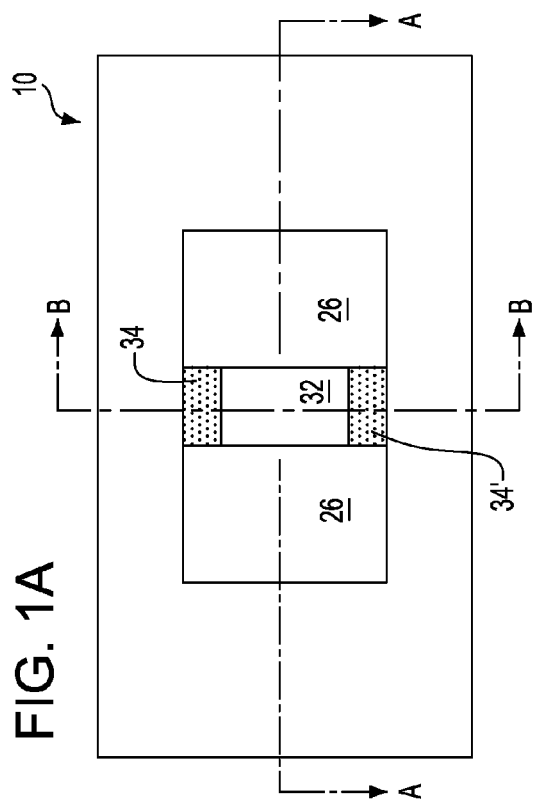
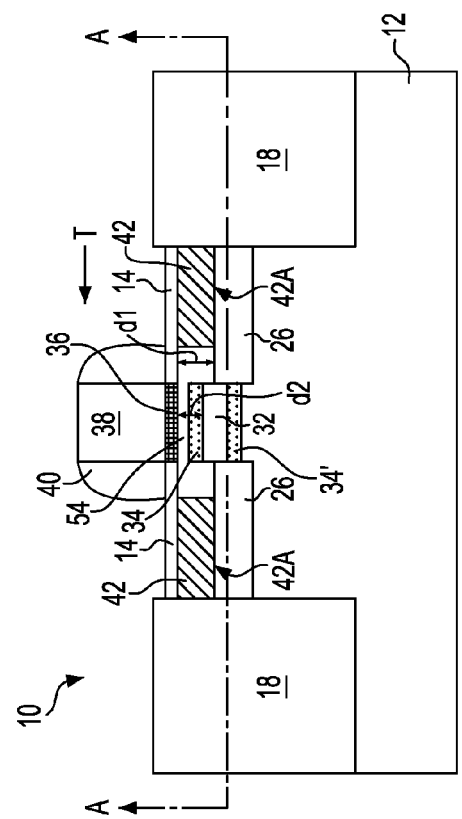
FIG. 1A
FIG. 1B
FIG. 1C

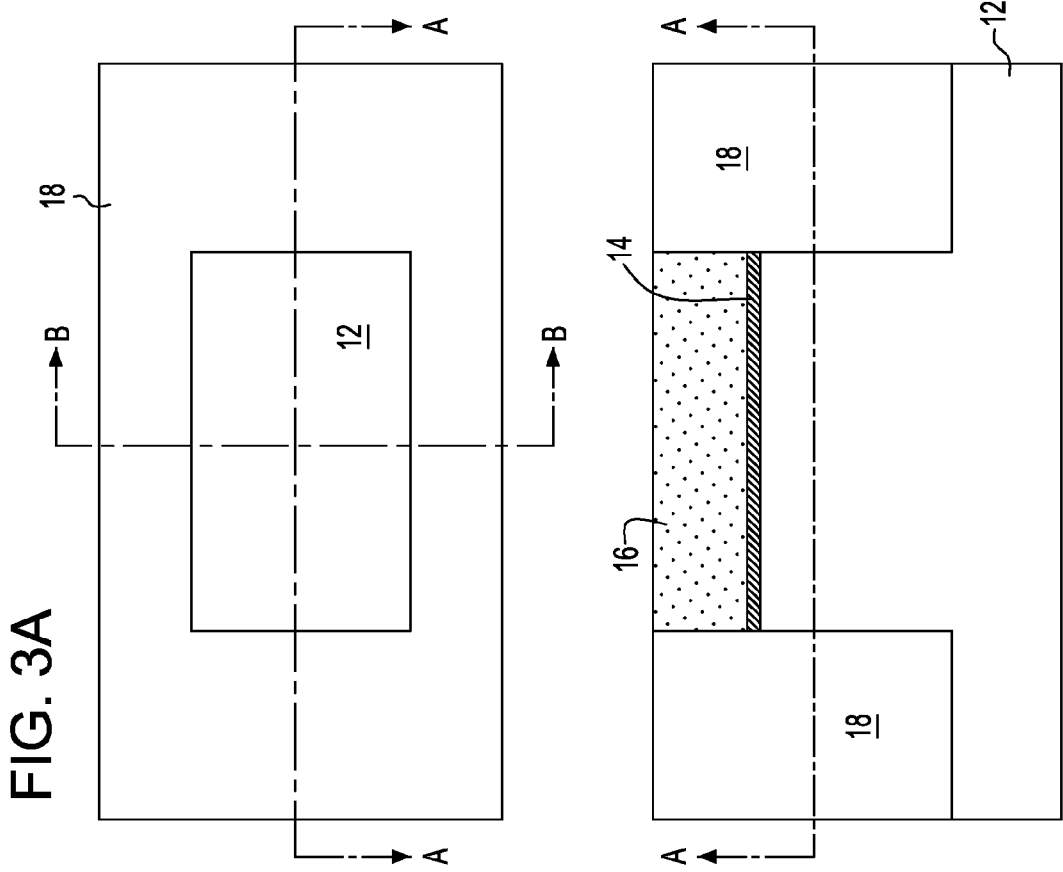

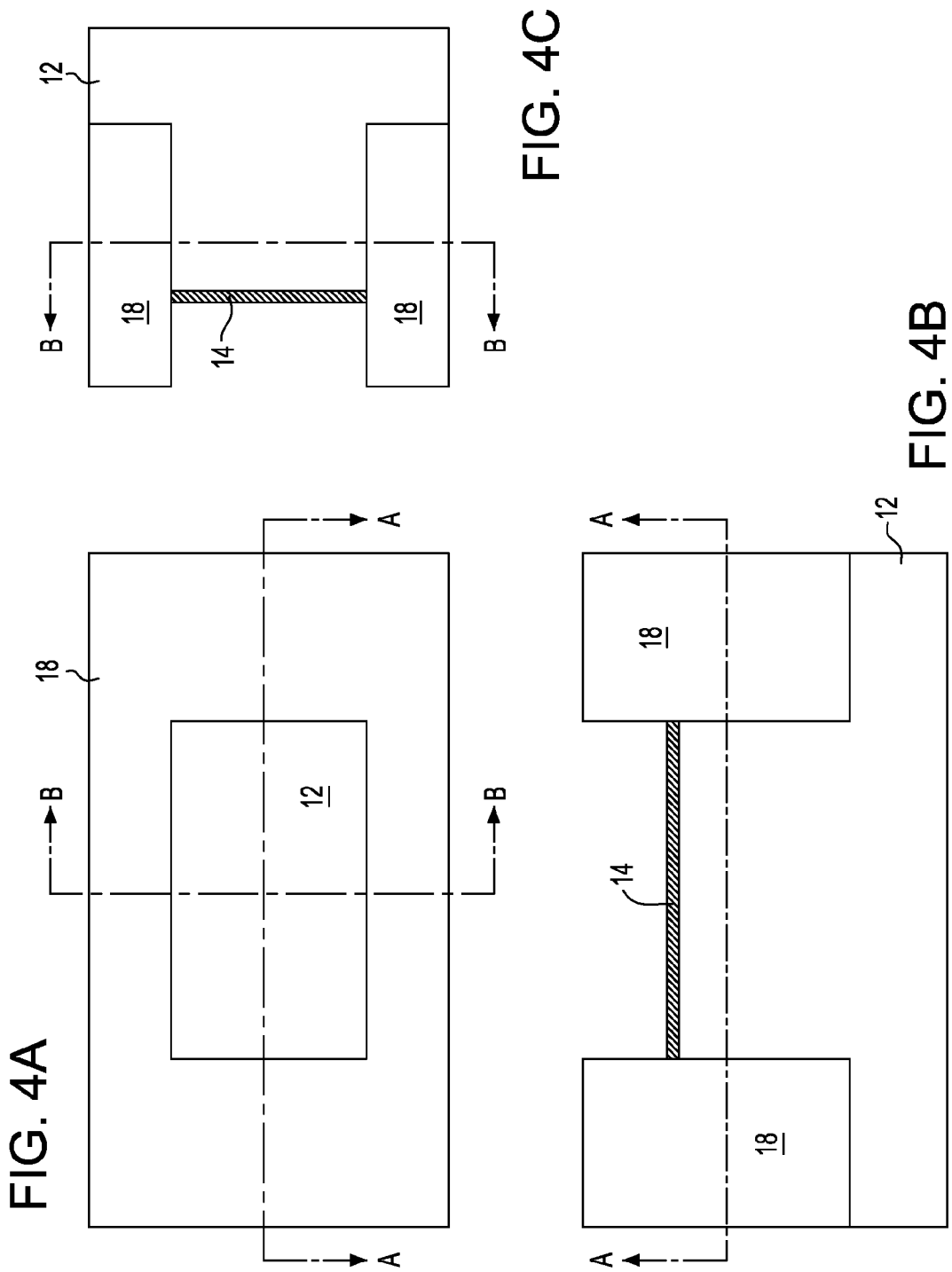

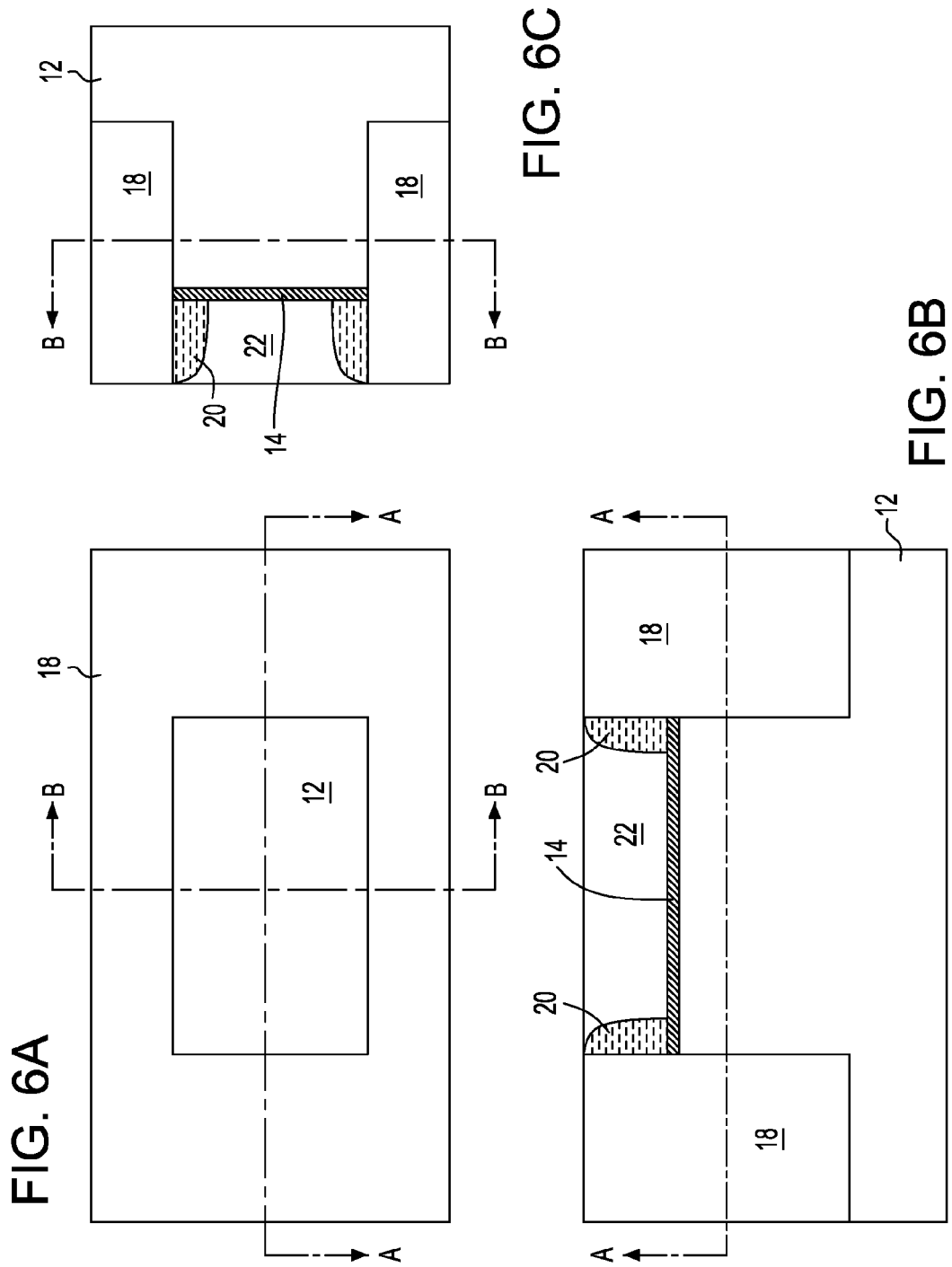

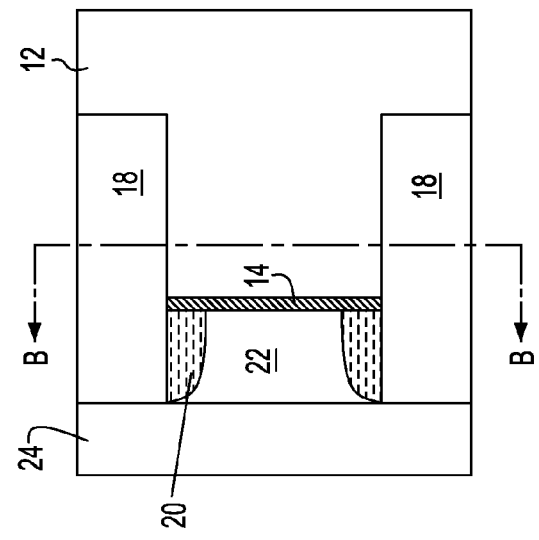
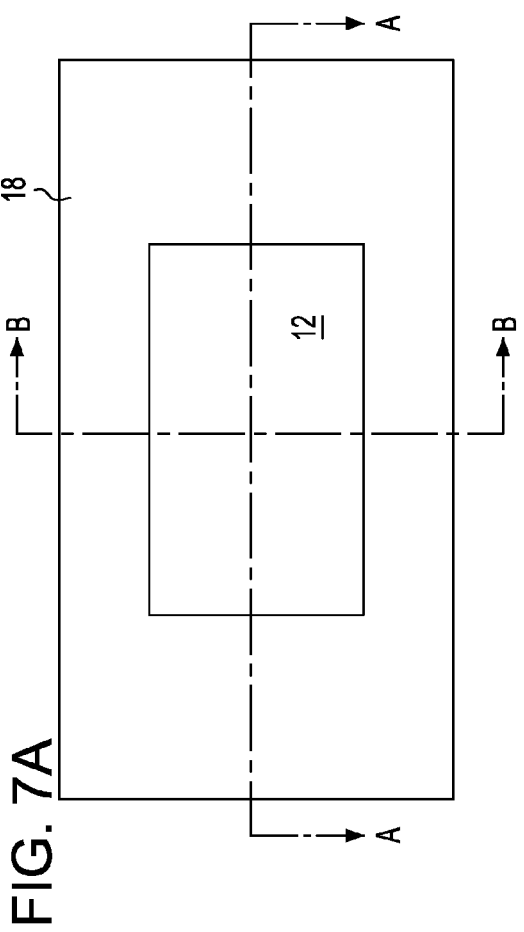
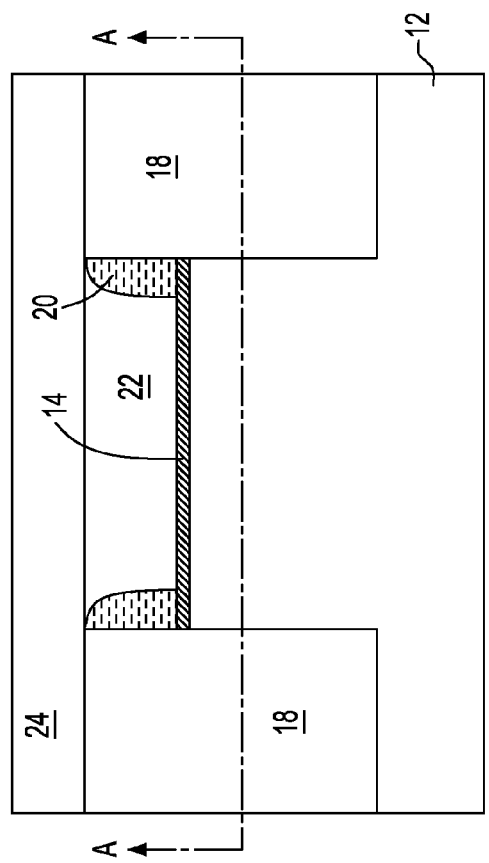

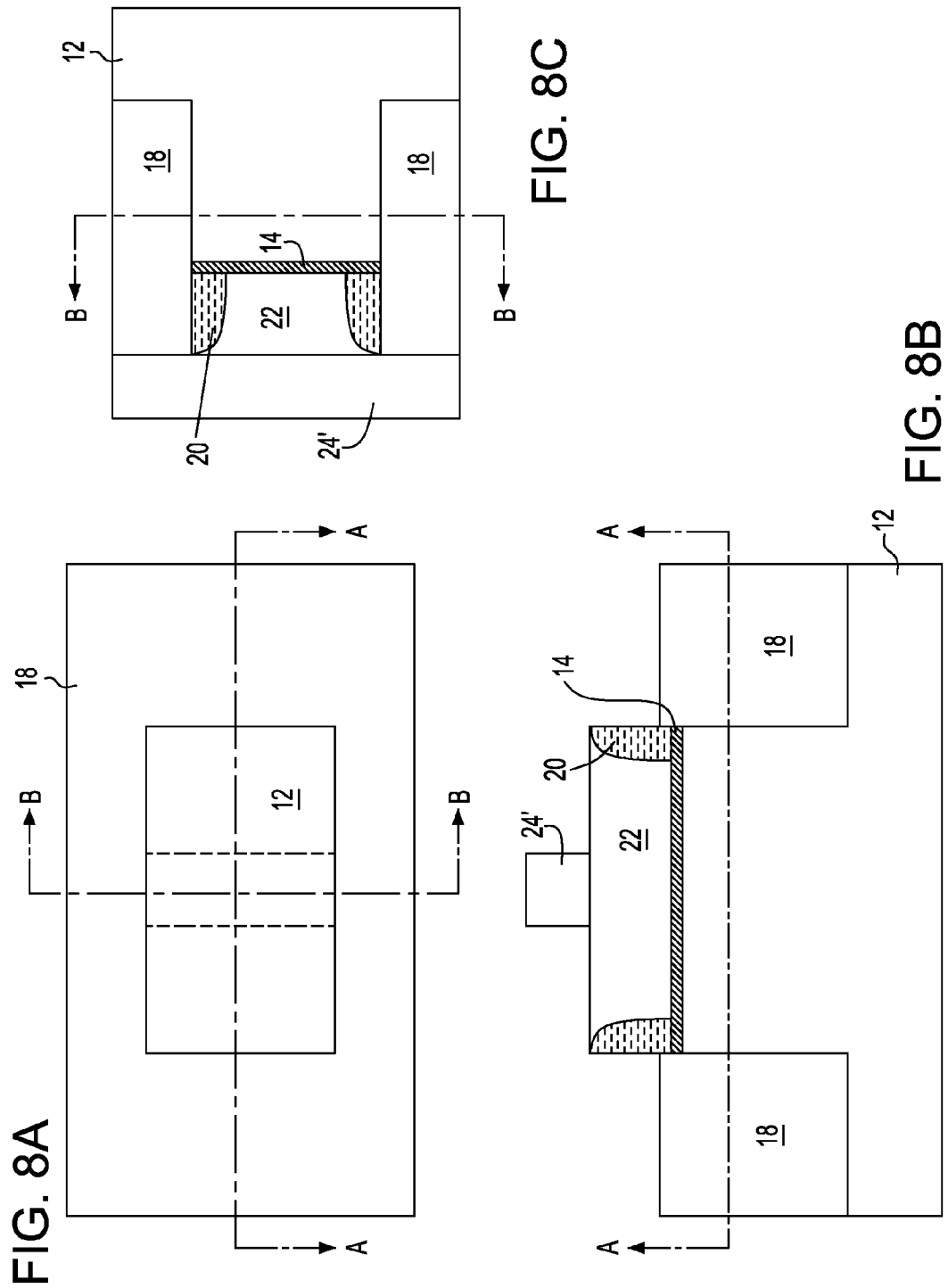

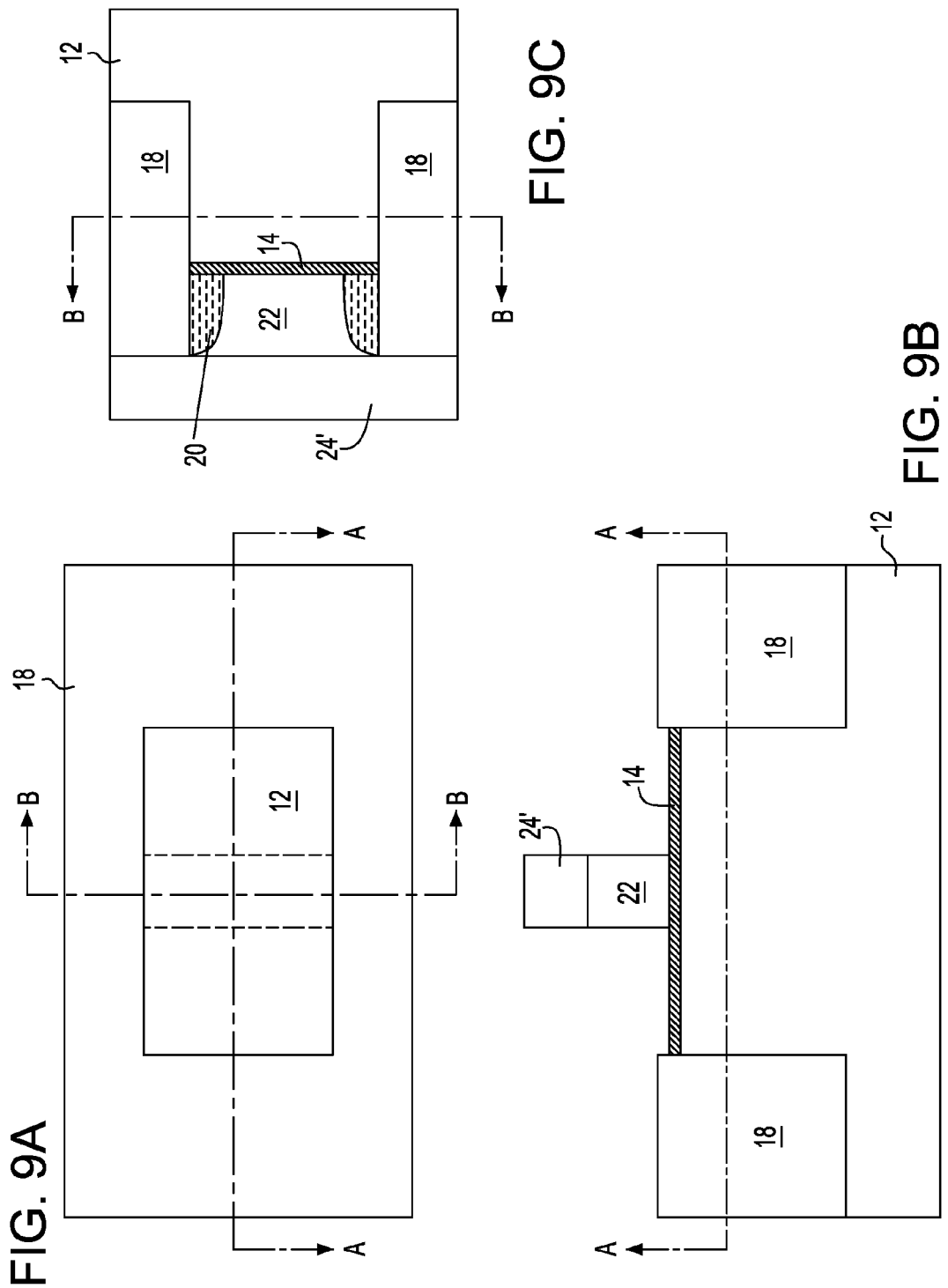

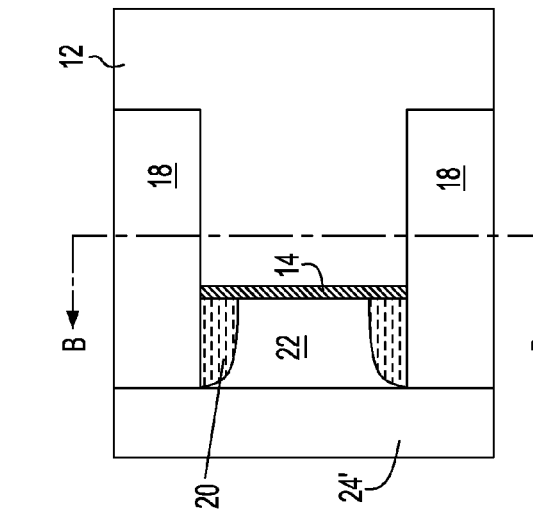
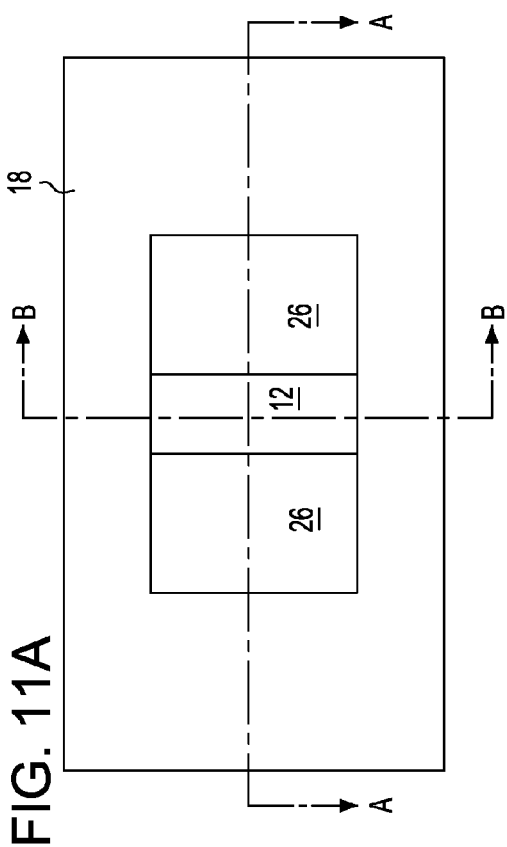
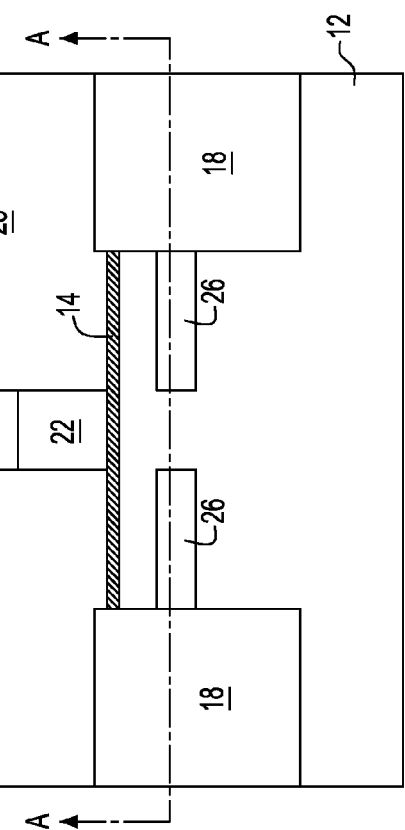

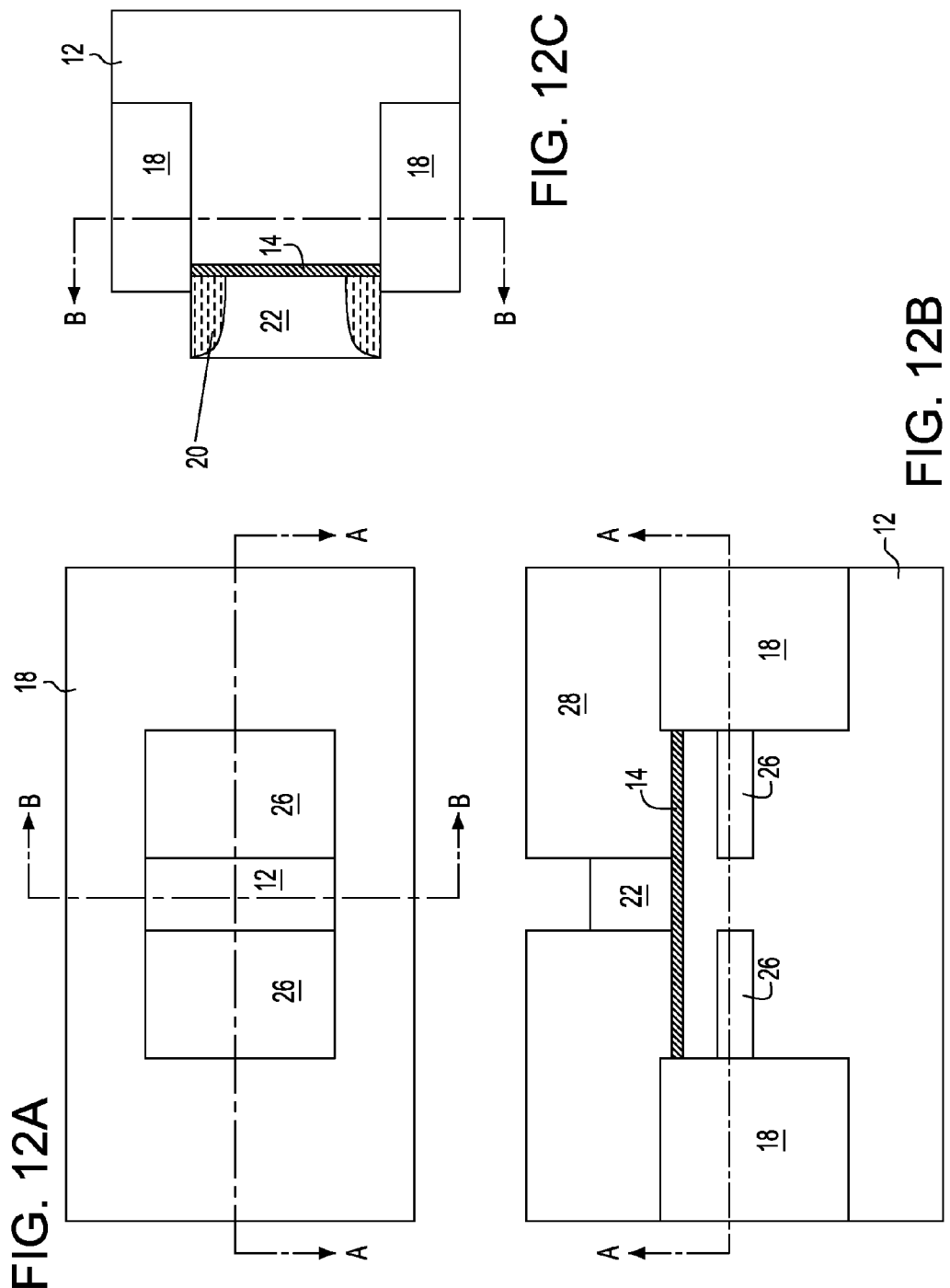

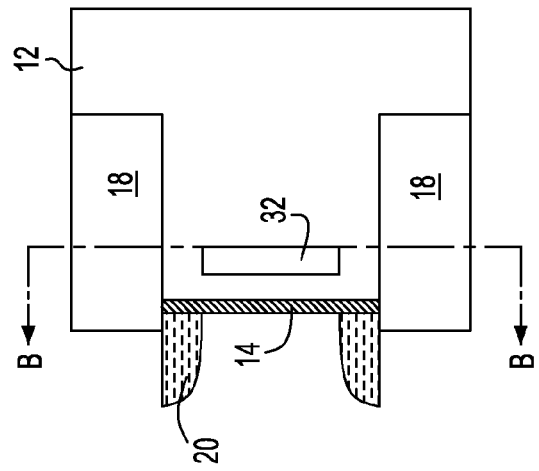
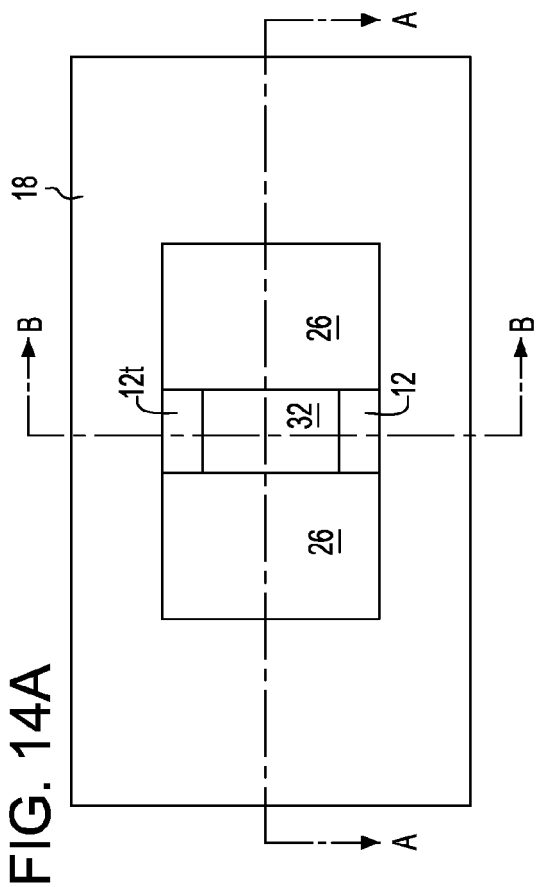
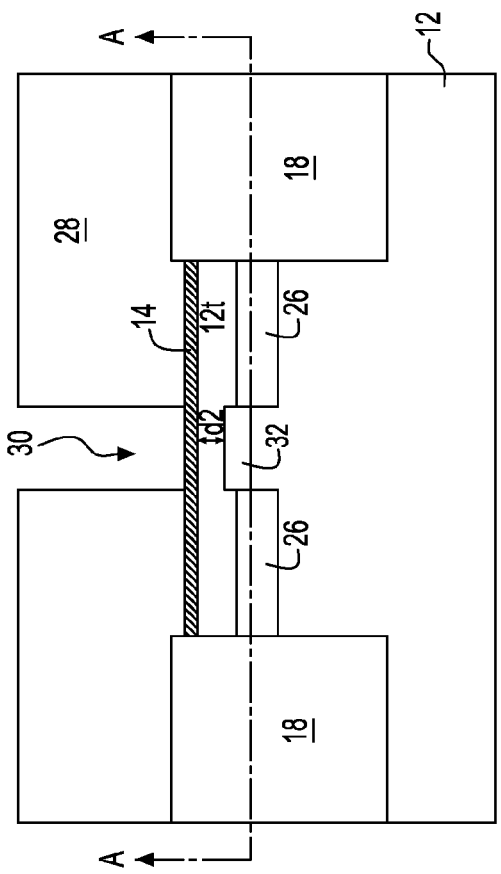

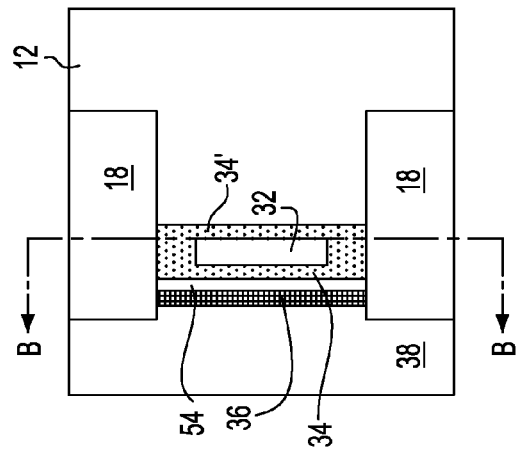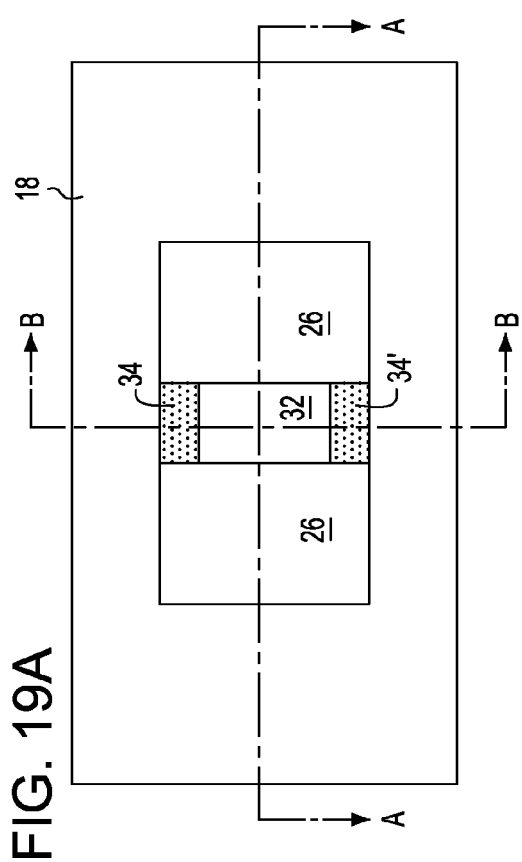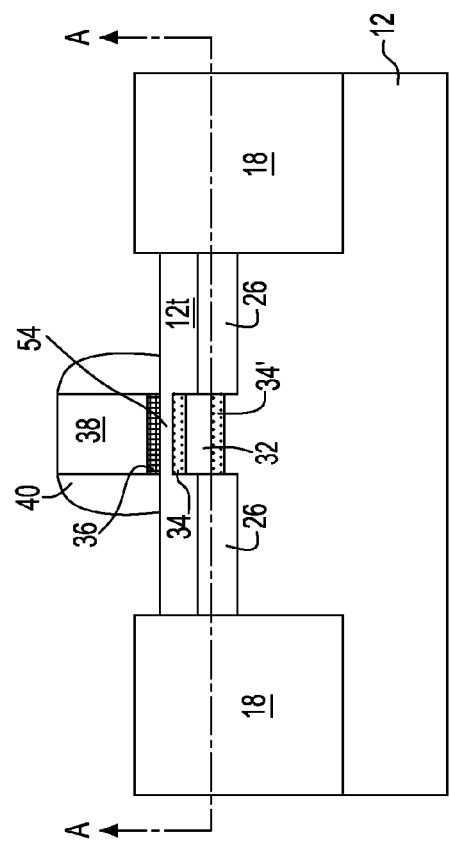

DEEP JUNCTION SOI MOSFET WITH ENHANCED EDGE BODY CONTACTS

FIELD OF THE INVENTION

The present invention relates to a semiconductor structure having body contacts that are located at the edges of the device channel and a buried insulating region under the device channel that is shallower than the buried insulating regions under the source/drain junctions and a method of fabricating the same.

BACKGROUND OF THE INVENTION

Semiconductor-on-insulator (SOI) metal oxide semiconductor field effect transistors (MOSFETs) have demonstrated switching performance advantages over bulk MOSFETs, mainly resulting from low junction capacitance. However, the lack of body contacts on SOI MOSFETs presents serious concerns related to floating body and past performance history effects, as well as electrical instability due to self-heating.

Since floating body and history effects result in threshold voltage (Vt) mismatch and aggravated leakage currents, it is highly desirable to use body contacts in applications such as static random access memory (SRAM) cells, sense amplifiers, differential amplifiers, pass transistors and dynamic random access memory (DRAM) array transistors. Otherwise greater efforts in circuit design and device design are needed to take care of the floating body issues. Floating body effects also complicate the mapping of bulk complementary metal oxide semiconductor (CMOS) circuit designs to SOI technology.

Much prior art exists which teaches body contacted SOI structures. Some of the prior art provides connection to the body via a path under the gate conductor. Other prior art uses body-to-source ties. Still other prior art forms the back gate oxide only directly under the source/drain diffusions and leaves the channel connected to the bulk substrate. However, with the shrinking of an MOSFET's gate length, it is increasingly difficult to align the oxide under the source/drain diffusions with the connection under the gate.

Therefore, a need exits for a body contacted SOI MOSFET having a thick buried insulating region under the source/drain diffusions to preserve most of the performance advantages of SOI technology.

SUMMARY OF THE INVENTION

The present invention provides a semiconductor structure having body contacts that are located at the edges of the device channel and a buried insulating region under the device channel that is shallower than the buried insulating regions under the source/drain junctions. More specifically, the present invention provides a semiconductor-on-insulator (SOI) metal oxide semiconductor field effect transistor (MOSFET) which has a buried insulating region under the device channel that is shallower than the buried insulating regions that are located under the source/drain junctions. The term "junctions" denotes the boundary between the source/drain and the device body region.

In addition, the inventive SOI MOSFET has low resistance body contacts that are positioned at the edges of the device channel. The inventive structure also has a retrograde doping profile of the device body. By 'retrograde' it is meant the peak of the vertical doping profile is below the surface.

Moreover, the inventive structure has no highly doped PN junctions that are known to cause current leakage in some devices. Also, all the aforementioned features of the inventive structure are self-aligned to the gate conductor.

In general terms, the present invention provides a semiconductor structure which includes at least one field effect transistor located on a top semiconductor layer of a semiconductor-on-insulator (SOI) substrate. The at least one field effect transistor includes a gate conductor located on a surface of a gate dielectric, the gate dielectric is in turn located on the top semiconductor layer of the SOI substrate. A channel region lies beneath the gate dielectric/gate conductor stack and is laterally confined by source/drain diffusion regions, each of which forms a junction with the top semiconductor layer in which they are embedded.

The SOI substrate also includes first buried insulating regions having a first depth that are located beneath the source/drain diffusion regions and a second buried insulating region having a second depth located beneath the channel region. In the inventive structure, the second depth is shallower than the first depth.

Body contacts are also located in the SOI substrate. Specifically, the inventive structure includes an upper body contact of low contact resistance located in the top semiconductor layer of the SOI substrate and a lower body contact, also of low contact resistance, located in the bottom semiconductor layer of the SOI substrate. The upper and lower body contacts are located on opposing surfaces of the second buried insulating region that is beneath the device channel. More importantly, however is that the upper and lower body contacts have enhanced edge contact. By 'enhanced edge contact' it is meant that the upper and lower body contacts of the inventive structure are in contact with each other at the edges of the device channel.

A method for fabricating the inventive structure is also provided. The inventive method provides for self-alignment of the various features with the gate conductor of the device. No additional masking layers are required in the inventive method. This avoids both the area penalty due to alignment error and additional costs associated with an extra litho layer.

The inventive method begins by first providing a structure including raised trench isolation regions which extend into a semiconductor substrate. A patterned dummy gate region is then formed atop the semiconductor substrate and first buried insulating regions are formed into the semiconductor substrate utilizing the patterned dummy gate region as an ion implantation mask. Next, a planarizing material is provided and thereafter the patterned dummy gate region is removed so as to expose a portion of the substrate which is located between the previously formed first buried insulating regions. A second buried insulating region having a shallower depth than the first buried insulating regions is then formed into the exposed portion of the semiconductor substrate. Next, body contacts are formed into the semiconductor substrate in areas above and below the second buried insulating region. The body contacts are in contact with each other at the edges of the device channel. With the planarizing material still in place, a gate dielectric and a gate conductor are formed above the second buried insulating region. Next, the planarizing material is removed, spacers are formed and then source/drain diffusions are formed into the semiconductor substrate above the first buried insulating regions.

BRIEF DESCRIPTION OF THE DRAWINGS

FIGS. 1A-1C are pictorial representations (through various views including top-down and cross sectional) of the inventive semiconductor structure in accordance with one embodiment of the present invention.

FIGS. 3A-19C are pictorial representations (through various views including top-down and cross sectional) illustrating the basic processing steps that are employed in fabricating the semiconductor structure illustrated in FIGS. 2A-2C.

DETAILED DESCRIPTION OF THE INVENTION

Figure 2C:
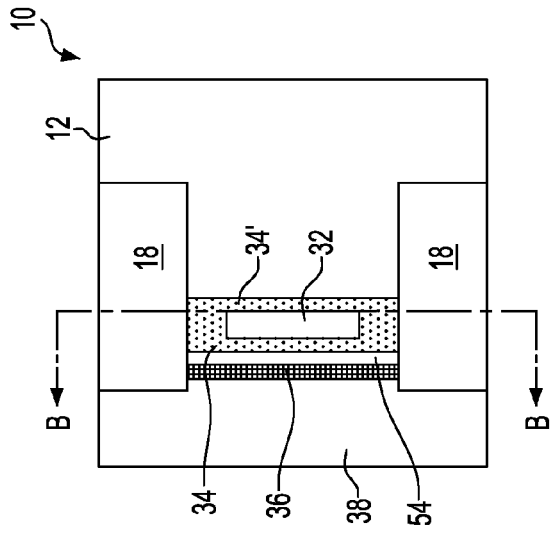
FIGS. 2A-2C are pictorial representations (through various views including top-down and cross sectional) of the inventive semiconductor structure in accordance with another embodiment of the present invention.

The present invention, which provides a deep junction SOI MOSFET with enhanced edge body contacts and a retrograde channel as well as a method of forming the same, will now be described in greater detail by referring to the following discussion and drawings that accompany the present application. It is noted that the drawings of the present application are provided for illustrative purposes and, as such, the drawings are not drawn to scale. Moreover, in each of the drawing figures provided, a top-down view is shown together with cross sectional views through lines A-A (length direction of the device) and B-B (width direction of the device).

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, one aspect of the present invention relates to a deep junction SOI MOSFET with enhanced edge body contacts and a retrograde channel. Such a structure is shown, for example, in FIGS. 1A-1C and 2A-2C. In both of the structures illustrated, there is present a buried insulating layer under the channel that is shallower than the buried insulating region under the source/drain junctions, the edge body contacts have enhanced doping, and the channel has a retrograde doping profile. Moreover, the inventive structure as illustrated in FIGS. 1A-1C and 2A-2C are formed such that the channel doping is separated from the junction doping by gate sidewalls spacers; thus no highly doped PN junction is formed.

Specifically, FIGS. 1A-2C illustrates the inventive semiconductor structure in accordance with different embodiments of the present. In the embodiment shown in FIGS. 1A-1C, the pad oxide layer 14 remains in the structure and it is adjoining the gate dielectric 36. In the other embodiment which is shown in FIGS. 2A-2C, the pad oxide layer has been completely removed from the structure.

Each of the semiconductor structures shown in FIGS. 1A-2C includes at least one field effect transistor, T, located on a top semiconductor layer of a semiconductor-on-insulator (SOI) substrate. The at least one field effect transistor T includes a gate conductor 38 located on a surface of a gate dielectric 36, the gate dielectric 36 is in turn located on the top semiconductor layer of the SOI substrate. A channel region 54 lies beneath the gate dielectric/gate conductor stack and is laterally confined by source/drain diffusion regions 42, each of which forms a junction 42A with the top semiconductor layer in which they are embedded.

The SOI substrate also includes first buried insulating regions 26 having a first depth d1 that are located beneath the source/drain diffusions 42 and a second buried insulating region 32 having a second depth d2 located beneath the channel region 54. In the inventive structure, the second depth is shallower than the first depth.

Body contacts 34 and 34' are also located in the SOI substrate. Specifically, the inventive structure includes an upper body contact 34 of low contact resistance located in the top semiconductor layer of the SOI substrate and a lower body contact 34', also of low contact resistance, located in the bottom semiconductor layer of the SOI substrate. The upper and lower body contacts are located on opposing surfaces of the second buried insulating region that is beneath the device channel. More importantly, however is that the upper and lower body contacts have enhanced edge contact.

The other elements of FIGS. 1A-2C which are labeled in the drawings, but not described above, are fully described in the following discussion of the basic processing steps of the present invention which are used in fabricating the inventive structure.

Figure 2A:
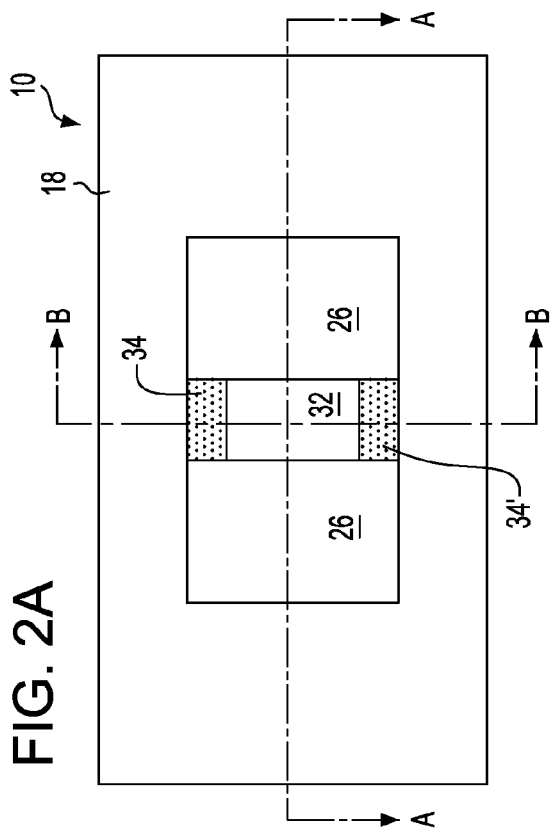
Figure 2B:
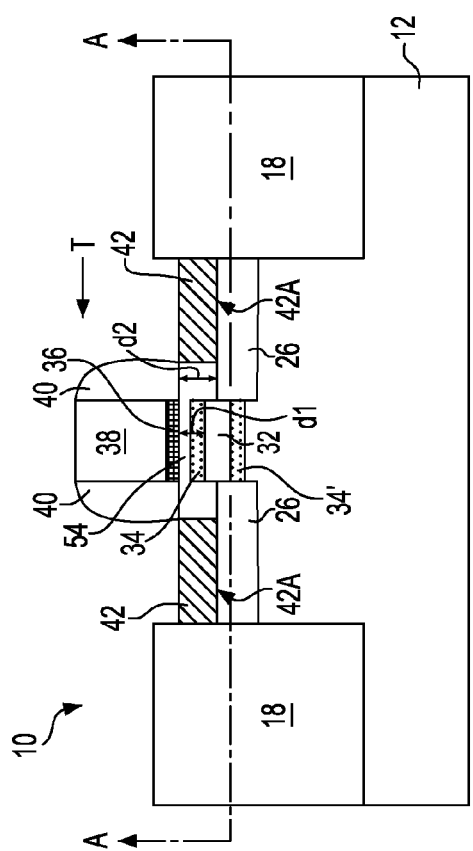

Reference is now made to FIGS. 3A-19C which illustrate the basic processing steps of the present invention that are used in forming the structure shown in FIGS. 2A-2C. It is noted that the basic processing steps shown in these drawings can also be used in forming the structure shown in FIGS. 1A-1C as will be described herein below.

FIGS. 3A-3C illustrate an initial structure 10 that is employed in the present invention. The initial structure 10 comprises a semiconductor substrate 12, a pad oxide layer 14, a pad nitride layer 16 and raised trench isolation regions 18 that are formed into the semiconductor substrate 12, the pad oxide layer 14 and the pad nitride layer 16. It is noted that the area between neighboring raised trench isolation regions defines active areas in which semiconductor devices, such as the inventive SOI MOSFET, can be formed.

The initial structure 10 is comprised of materials that are well known to those skilled in the art and the initial structure 10 is fabricated utilizing techniques well known to those skilled in the art as well.

The semiconductor substrate 12 is comprised of any conventional semiconducting material including, but not limited to Si, SiC, SiGe, SiGeC, Ge alloys, GaAs, InAs, InP, as well as other III-V or II-VI compound semiconductors. The semiconductor substrate 12 may also comprise a layered semiconductor such as, for example, Si/SiGe. Preferably, the semiconductor substrate 12 is comprised of a Si-containing semiconductor material that includes silicon. The semiconductor substrate may be doped, undoped or contain both doped and undoped regions therein.

The semiconductor substrate 12 may have a single crystal orientation in which an upper surface thereof is oriented along one of the crystal planes of the semiconductor material, i.e., oriented along the {100}, {110} or {111} crystal planes of silicon. The semiconductor substrate 12 may also be comprised of a hybrid-oriented semiconductor in which surface regions of the substrate have different crystal orientations.

After providing the semiconductor substrate 12, a pad oxide layer 14 is formed on the surface of the semiconductor substrate 12 utilizing a conventional deposition process such as, for example, chemical vapor deposition (CVD), plasma enhanced chemical vapor deposition (PECVD), evaporation, chemical solution deposition and atomic layer deposition. Alternatively, the pad oxide layer 14 can be formed by a thermal oxidation process. The thickness of the pad oxide layer 14 may vary depending on the process used in forming the same. A typical, but not necessary, thickness for the pad oxide layer 14 is from about 2 to about 10 nm.

After forming the pad oxide layer 14, a pad nitride layer 16 is formed on a surface of the pad oxide layer 14 by utilizing one of the above mentioned deposition processes that were used in forming the pad oxide layer 14. Alternatively, a thermal nitridation process can be used in the present invention for forming the pad nitride layer 16. The thickness of the pad nitride layer 16 may vary depending on the process used in forming the same. A typical, but not necessary, thickness for the pad nitride layer 16 is from about 50 to about 200 nm.

The raised trench isolation regions 18 are then formed by utilizing a conventional trench isolation process well known to those skilled in the art. For example, lithography, etching and filling of a trench with a trench dielectric such as an oxide may be used in forming the raised trench isolation regions 18. Optionally, a liner (not shown) can be formed into the trench prior to filling the trench with a trench dielectric. Other optional processing steps of forming the raised trench isolation regions 18 include: a densification step and/or a planarization process.

After providing the initial structure 10 shown in FIGS. 3A-3C, the remaining pad nitride layer 16 is removed from the structure utilizing a conventional stripping process that selectively removes nitride as compared to oxide. This step of the present invention exposes the remaining pad oxide layer 14 as is shown in FIGS. 4A-4C.

Figure 5A:
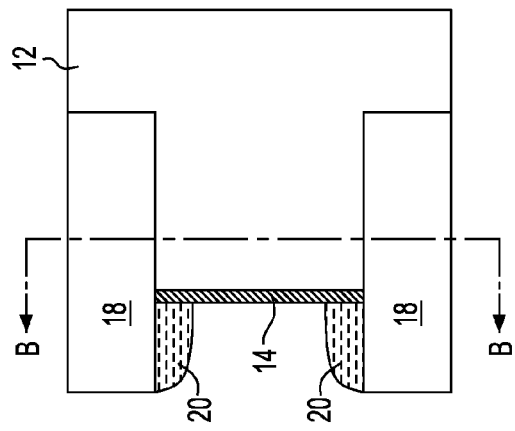
Figure 5B:
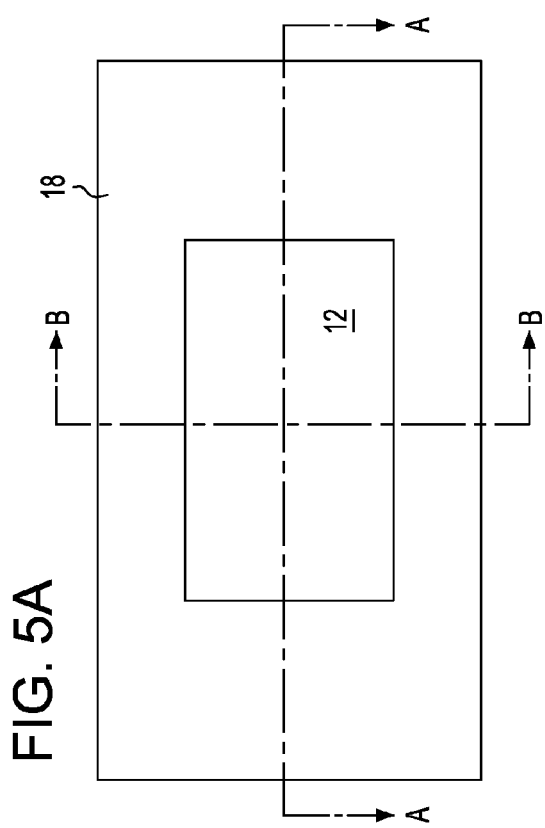
Figure 5C:
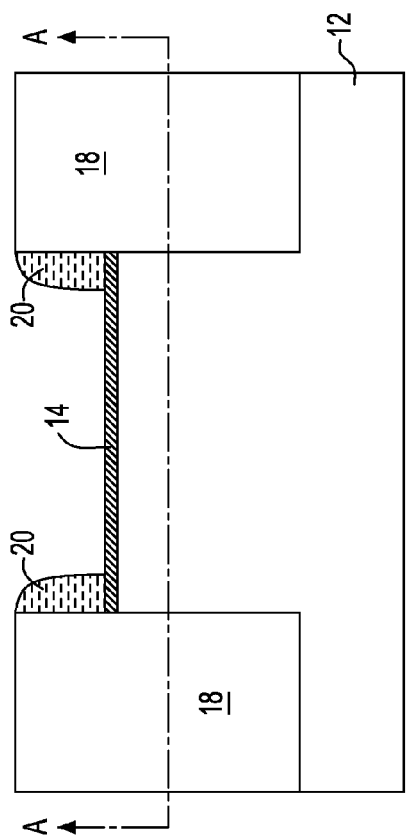
Figure 10A:
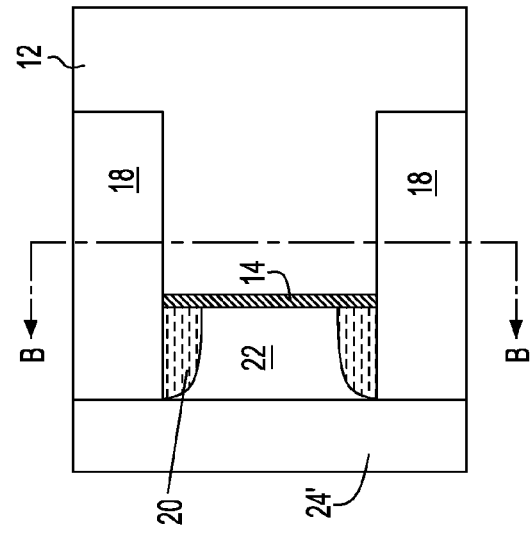
Figure 10B:
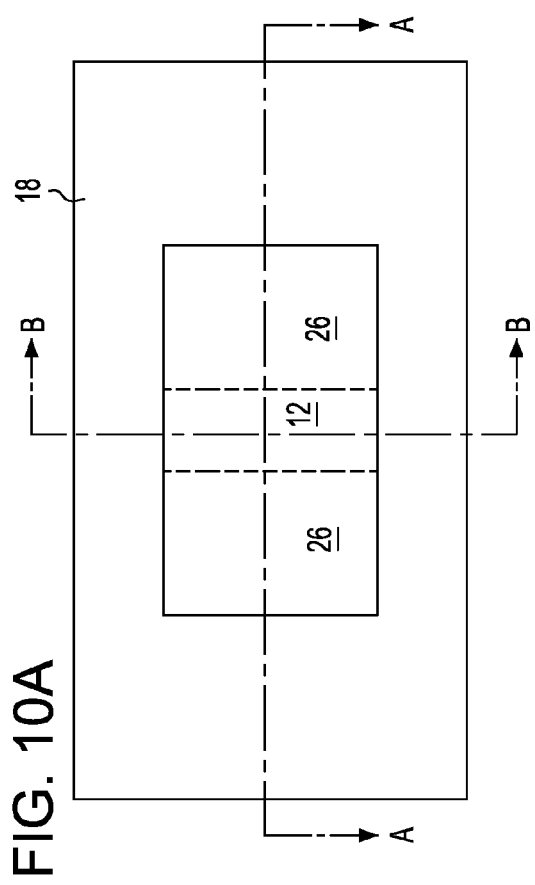
Figure 10C:
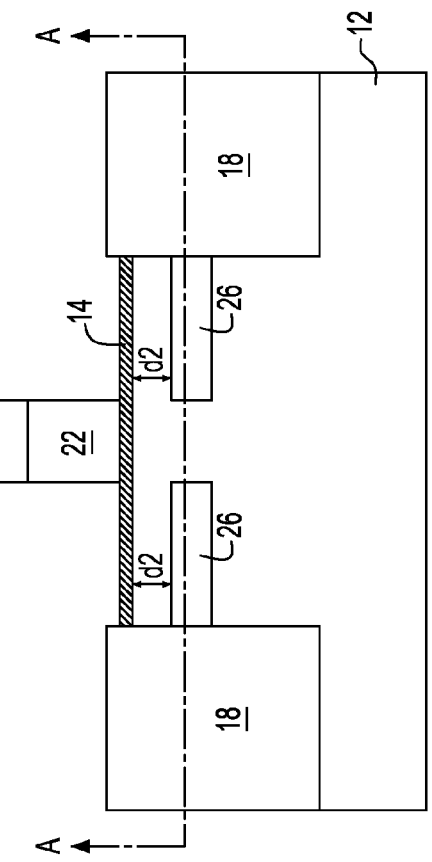

FIGS. 5A-5C illustrate the structure after forming nitride spacers 20 on top of an exposed portion of the pad oxide layer 14. The nitride spacers 20 are also formed on sidewall portions of the raised isolation trench regions 18 which were exposed after removing the pad nitride layer 16 from the structure. The nitride spacers 20 are formed utilizing a conventional deposition process, followed by etching.

Next, a sacrificial layer 22 is formed utilizing a conventional deposition process and thereafter the sacrificial layer is planarized to provide the structure shown, for example, in FIGS. 6A-6C. The planarization process comprises a conventional technique such as chemical planarization mechanical planarization (CMP) and/or grinding. The sacrificial layer 22 can be comprised of any material besides an oxide or nitride. Typically, polysilicon (i.e., polySi) is employed as the sacrificial layer 22.

FIGS. 7A-7C shows the structure that is formed after forming an oxide cap layer 24 on the structure shown in FIGS. 6A-6C. As is illustrated, the oxide cap layer 24 is formed atop the raised trench isolation regions 18, the sacrificial layer 22 and the nitride spacers 20. The oxide cap layer 24 is formed utilizing a conventional deposition process including, but not limited to CVD and PECVD. The thickness of the oxide cap layer 24 may vary. Typically, the oxide cap layer 24 has a thickness from about 50 to about 150 nm.

The oxide cap layer 24 is then patterned by lithography and etching providing the structure shown, for example, in FIGS. 8A-8C. In these drawings, the patterned oxide cap layer is designated by reference numeral 24'. As is shown, the patterned oxide cap 24' protections at least one portion of the sacrificial layer 22, while leaving other portions of the sacrificial layer 22 exposed. It is noted that during this etching process some portions of the raised trench isolation regions 18 are removed.

An isotropic etching process selective to oxide such as a reactive ion etch using $SF_6$ is then used to remove the exposed portions of the sacrificial layer 22; this etching step also removes the nitride spacers 20 in the cross sectional view A-A. The resultant structure that is formed after this etching step has been performed is shown, for example, in FIGS. 9A-9C. It is noted that the patterned oxide cap 24' and the etched sacrificial layer 22 also serve as a dummy gate region in the present application. In the etching process, the patterned dielectric cap 24' is used as an etch mask. As is shown, the etching process stops atop the remaining pad oxide layer 14 that is located between neighboring raised trench isolation regions 18.

At this point of the present invention, first buried insulating regions 26 having a first depth are formed utilizing the patterned dielectric cap 24' and the patterned sacrificial layer 22 as an ion implantation mask. The resultant structure that is formed after the implantation and anneal steps is shown, for example, in FIGS. 10A-10C. The first buried insulating regions 26 are formed by implanting an ion such as for example, oxygen, nitrogen or both, into exposed portions of the semiconductor substrate 12 utilizing patterned layers 24' and 22 as an ion implantation mask and thereafter annealing the structure. The upper surface of each of the first buried insulating regions 26 are formed at a distance d1 that is from about 20 to about 100 nm from the upper surface of the semiconductor substrate 12. The annealing step is typically, but not necessarily, performed at a temperature of about 1200° C. or greater.

It is noted that the first buried insulating regions 26 may be referred to herein as the junction buried insulating regions since that are located above the S/D diffusion regions to be subsequently formed.

Next, and as shown in FIGS. 11A-11C, a nitride layer 28 is formed by a conventional deposition process and planarized to the upper surface of the patterned cap 24'. The patterned oxide cap 24' is then removed utilizing a timed etching process such as a timed reactive ion etching process providing the structure shown in FIGS. 12A-12C. It is noted that after the patterned oxide cap 24' has been removed, the underlying patterned sacrificial layer 22 is exposed as shown in FIGS. 12A-12C.

Figure 13C:
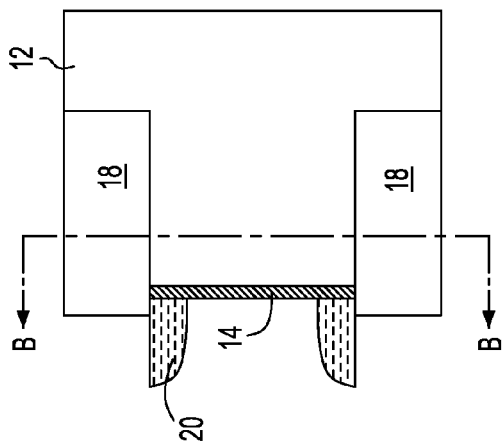
Figure 13A:
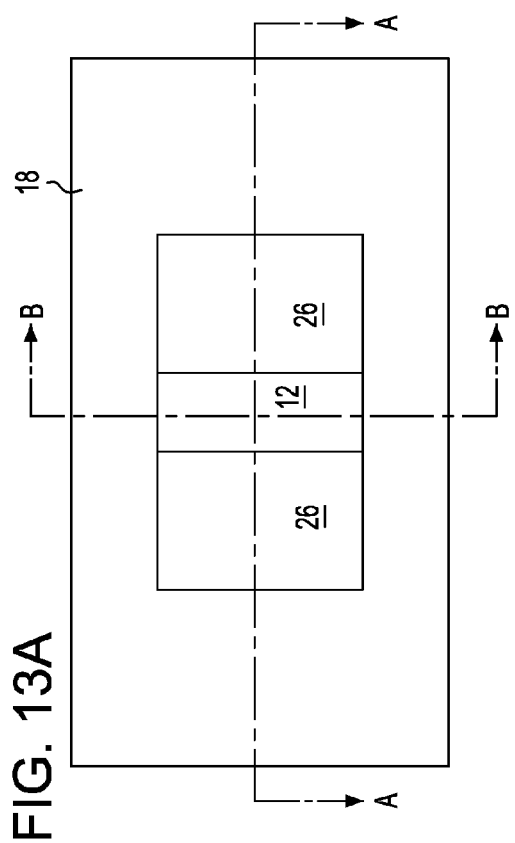
Figure 13B:
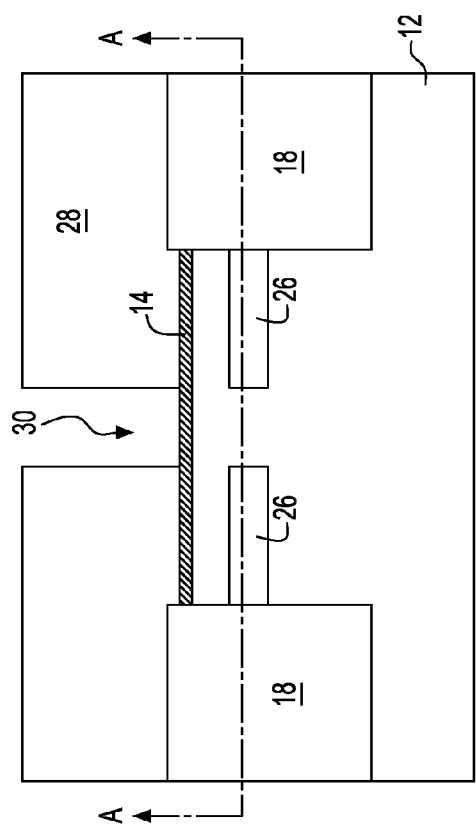
Figure 15C:
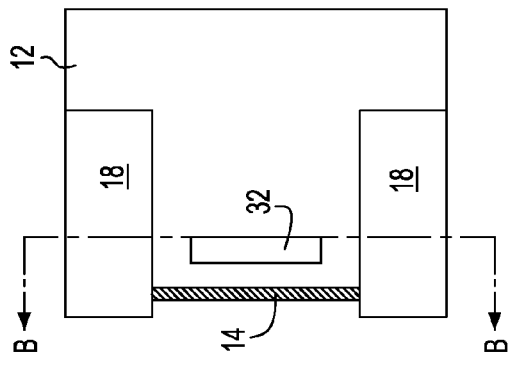
Figure 15A:
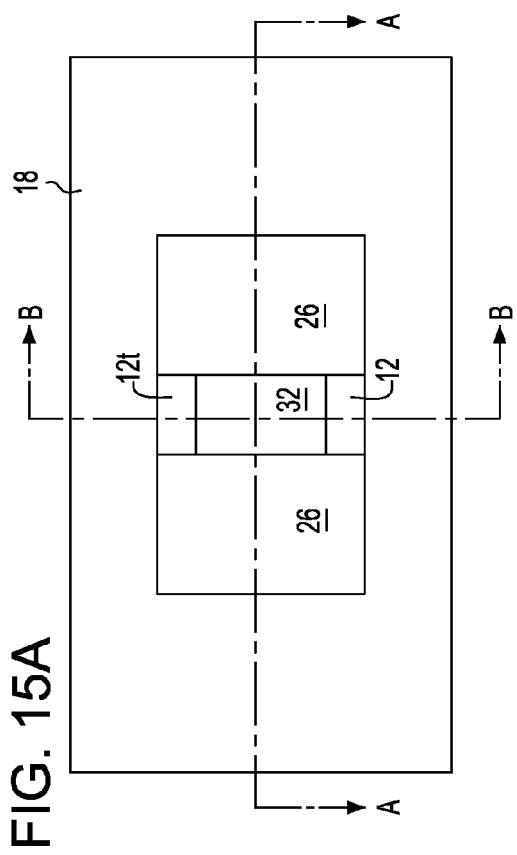
Figure 15B:
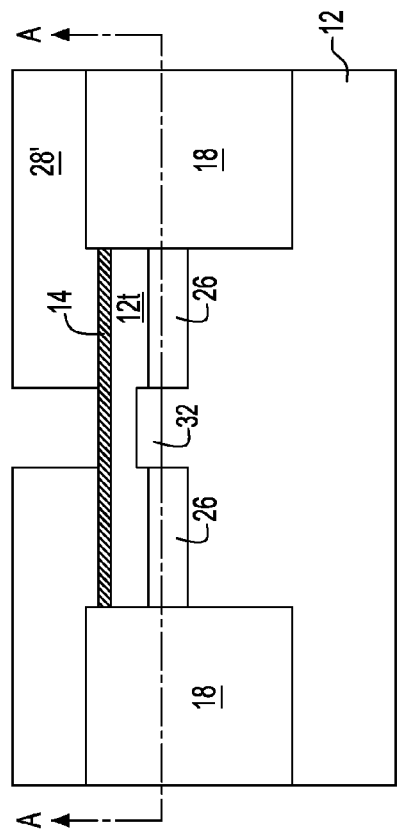
Figure 16A:
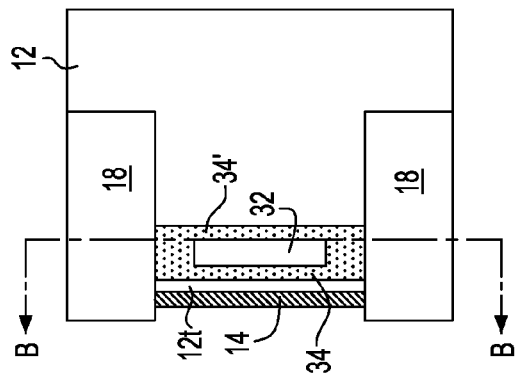
Figure 16B:
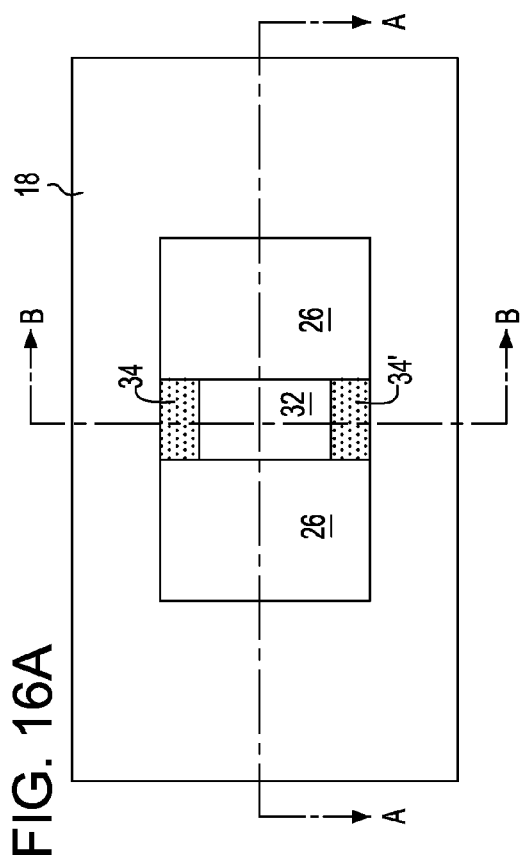
Figure 16C:
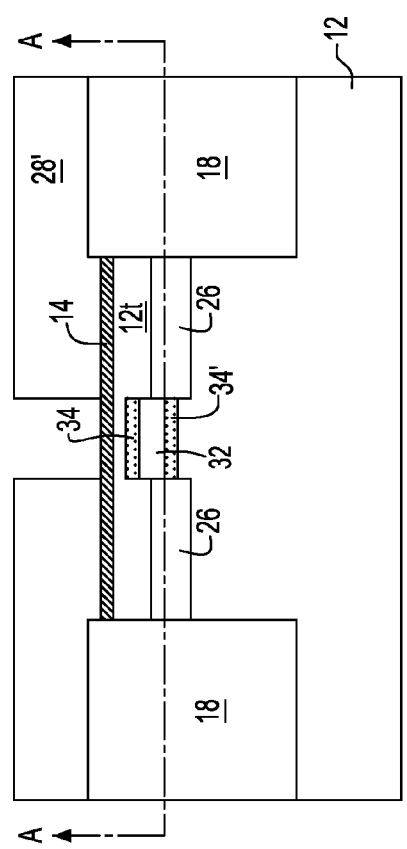

The remaining sacrificial layer 22 is then stripped utilizing a conventional stripping process to provide an opening 30 in the nitride layer 28 such as is shown in FIGS. 13A-13C. The opening 30 so provided has a width, W, of from about 20 to about 100 nm. The width determines the length of the device channel.

Next, a second buried insulating region 32 having a second depth which is less than the first depth of the first buried insulating regions 26 is formed by ion implantation and annealing. In forming the second buried insulating region 32, one of the above-mentioned ions used in forming the first insulating regions 26 may be used. Typically, the first and second buried insulating regions are each comprised of an oxide. In one embodiment of the present invention, the second buried insulating region 32 is in contact with the first buried insulating regions 26 such as is the case shown in FIGS. 14A-14C. In yet other embodiments of the present invention, the second buried insulating region 32 is not in contact with the first buried insulating regions 26. In this drawing, 12t denotes top semiconductor layer in which the device channel will be present.

Notwithstanding which of these embodiments are employed, the second buried insulating region 32 is shallower in depth than the first buried insulating regions 26. In FIGS. 14A-14C, d2 represents the distance from the upper surface of the second buried insulating region 32 to the upper surface of the semiconductor substrate 12. Typically, d2 has a value from about 5 to about 30 nm. It is noted the since the second buried insulating region 32 is located beneath the device channel, region 32 may be referred to herein as a channel buried insulating region. The first and second buried insulating regions separate portions of the semiconductor substrate 12 into a top semiconductor layer and a bottom semiconductor layer, e.g., the semiconductor substrate including the first and second buried insulating regions, is now an SOI substrate.

An etching processes that selectively removes nitride as compared with oxide is then performed to remove the nitride spacers 20 that remain in the cross sectional B-B. During this etching process, the nitride layer 28 is thinned forming thinned nitride layer 28'. The resultant structure that is formed after this step of the present invention has been performed is shown, for example, in FIGS. 15A-15C.

A performance enhancement implant is then performed to provide low resistivity (on the order of about 100 Ohm-cm or less) contacts in both the top semiconductor layer of the semiconductor substrate and the lower semiconductor layer of the substrate 12, which is below the buried insulating regions 26 and 32. The low resistance contacts are designated by reference numeral 34 and 34' in FIGS. 16A-16C. The low resistance contacts 34 and 34' are body contacts in which an edge portion thereof (See FIG. 16C) are in contact with each other. The performance enhancement implant includes ion implanting either an n- or p-type dopant into the substrate through the opening in the thinned nitride layer 28'. The low resistance upper and lower body contacts have a dopant concentration of about $10^{13}$ atoms/cm$^3$ or greater, with a dopant concentration from about $10^{14}$ to about $10^{16}$ atoms/cm$^3$ being more preferred.

Figure 17A:
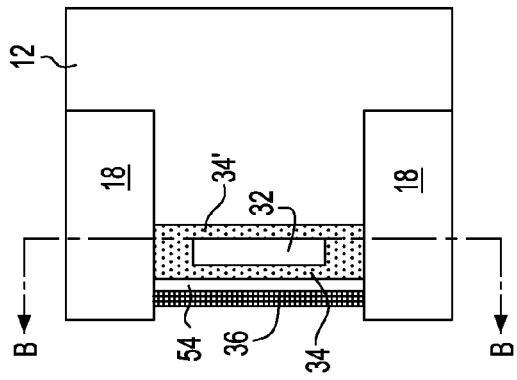
Figure 17B:
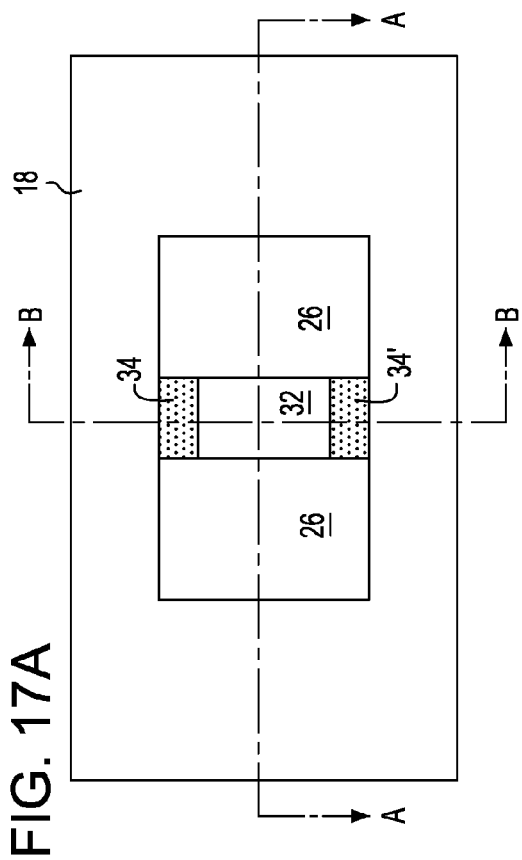
Figure 17C:
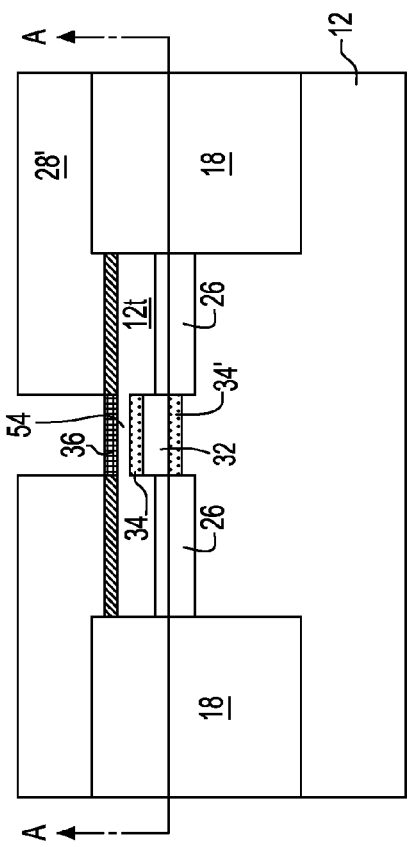
Figure 18C:
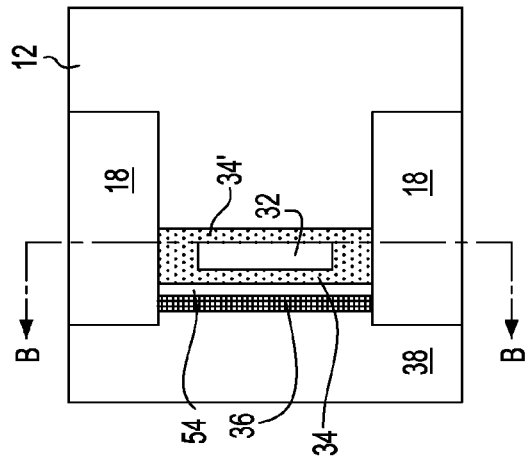
Figure 18A:
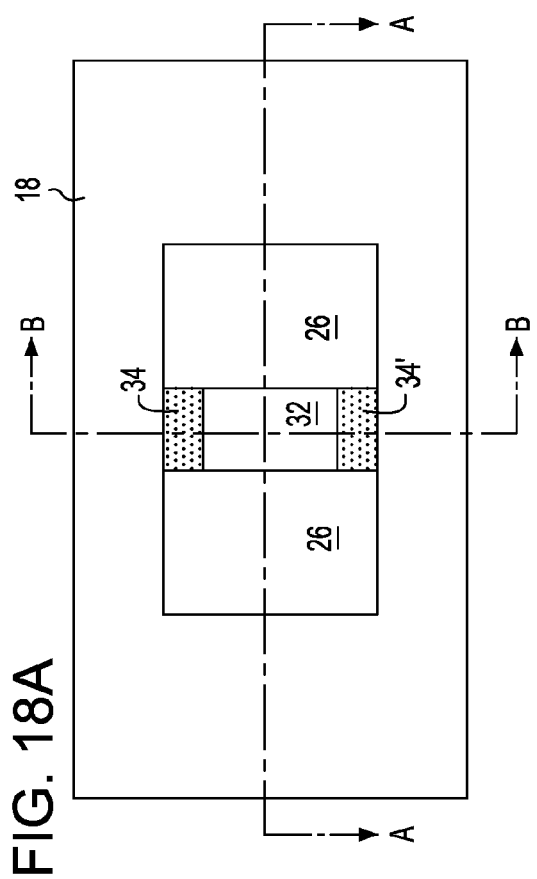
Figure 18B:
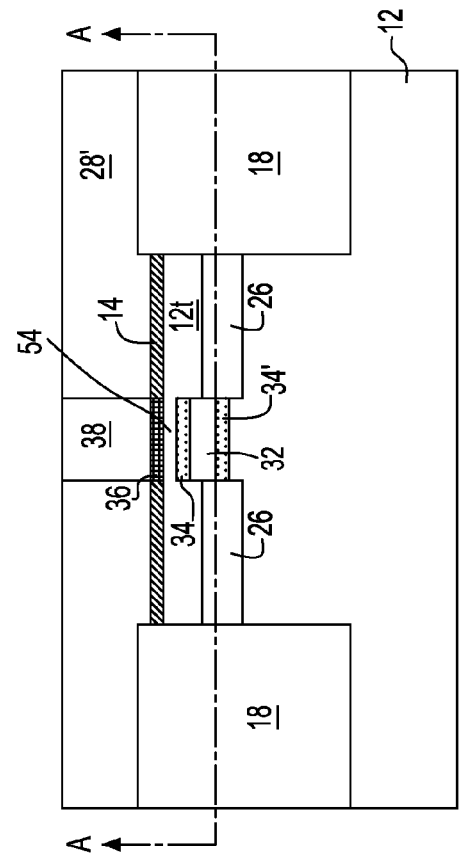

Next, the pad oxide layer 14 that is exposed by the opening in the thinned nitride layer 28' is then removed and a gate dielectric 36 is formed. The gate dielectric 36 comprises an oxide, nitride, oxynitride or multilayers thereof. Typically, the gate dielectric 36 is an oxide such as, for example, SiO$_2$, HfO$_2$, ZrO$_2$, Al$_2$O$_3$, SrTiO$_3$, LaAlO$_3$ and mixtures thereof. The physical thickness of the gate dielectric 36 may vary widely depending on the specific technique used in forming the same. Typically, the gate dielectric 36 has a thickness from about 0.5 to about 10 nm, with a thickness from about 1 to about 5 nm being more typical. The gate dielectric 36 is formed utilizing a conventional deposition technique or a thermal oxidation process can be used. The structure including the gate dielectric 36 is shown in FIGS. 17A-17C.

FIGS. 18A-18C-FIGS. 19A-19C illustrate the structure formed through the following processing steps: A gate conductor 38 is first formed atop the gate dielectric 36, the thinned nitride layer 28' is then removed, the remaining pad oxide layer 14 is also removed and at least one gate spacer 40 is formed on the sidewalls of the gate dielectric/gate conductor stack. The gate conductor 38 (See FIGS. 18A-18C) comprises polySi, SiGe, metals, metal silicates and combinations thereof. When polySi and SiGe are used a dopant is introduced into the Si-containing material to make those materials conductive. The dopant can be introduced into such Si-containing materials by an in-situ deposition process or by deposition and ion implantation. The gate conductor 38 is formed utilizing conventional techniques well known in the art.

After forming the gate conductor 38, the thinned nitride layer 28' is removed utilizing a conventional stripping process that selectively removes a nitride material. Next, the pad oxide layer 14 is removed utilizing a conventional stripping process that selectively removes oxide. It is noted that in some embodiments of the present invention, the pad oxide layer 14 remains in the structure so as to provide the structure shown in FIGS. 1A-1C. The following processing steps can be employed on structures with or without the pad oxide layer 14.

At this point of the inventive process, extension implants can be formed and thereafter at least one gate spacer 40 is formed on the gate dielectric 36/gate conductor 38 stack providing the structure shown, for example, in FIGS. 19A-19C. The at least one gate spacer 40 is formed by deposition and etching.

Junction implants are then performed utilizing conventional techniques forming source/drain diffusion regions 42 in the structure. The final structure including the source/drain diffusion regions 42 is shown in FIGS. 1A-1C or 2A-2C. It is noted that the boundary between the diffusion regions and remaining top semiconductor layer is referred to as S/D Junctions 42A.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A method of forming a semiconductor structure comprising:
    forming a patterned dummy gate region atop a semiconductor substrate;
    forming a first buried insulating region in the semiconductor substrate utilizing the patterned dummy gate region as an ion implantation mask;
    providing a planarizing material which exposes a top surface of the patterned dummy gate region;
    removing the patterned dummy gate region to expose a portion of the semiconductor substrate which is located between the first buried insulating region;
    forming a second buried insulating region having a shallower depth than the first buried insulating region into the exposed portion of the semiconductor substrate;
    forming body contacts into the semiconductor substrate in areas above and below the second buried insulating region, said body contacts having a dopant concentration of about $10^{13}$ atoms/cm$^3$ or greater;
    forming a gate dielectric and gate conductor above said second buried insulating region;
    removing the planarizing material; and
    forming source/drain diffusion regions into the semiconductor substrate above the first buried insulating region.

2. The method of claim 1 wherein said second buried insulating region is in contact with said first buried insulating region.

3. The method of claim 1 wherein said first buried insulating region is self-aligned to the gate conductor.

4. The method of claim 1 wherein said first buried insulating region and the second buried insulating region are formed by ion implantation and annealing.

5. The method of claim 1 wherein said body contacts are in contact with each other at edges of the device channel that is located in said semiconductor substrate below said gate conductor.

6. A method of forming a semiconductor structure comprising:
   forming a patterned dummy gate region atop a semiconductor substrate;
   forming a first buried insulating region in the semiconductor substrate utilizing the patterned dummy gate region as an ion implantation mask;
   providing a planarizing material which exposes a top surface of the patterned dummy gate region;
   removing the patterned dummy gate region to expose a portion of the semiconductor substrate which is located between the first buried insulating region;
   forming a second buried insulating region having a shallower depth than the first buried insulating region into the exposed portion of the semiconductor substrate;
   forming body contacts into the semiconductor substrate in areas above and below the second buried insulating region, said body contacts having a resistivity of less than about 100 Ohm-cm;
   forming a gate dielectric and gate conductor above said second buried insulating region;
   removing the planarizing material; and
   forming source/drain diffusion regions into the semiconductor substrate above the first buried insulating region.

7. The method of claim 6 wherein said second buried insulating region is in contact with said first buried insulating region.

8. The method of claim 6 wherein said first buried insulating region is self-aligned to the gate conductor.

9. The method of claim 6 wherein said first buried insulating region and the second buried insulating region are formed by ion implantation and annealing.

10. The method of claim 6 wherein said body contacts are in contact with each other at edges of the device channel that is located in said semiconductor substrate below said gate conductor.

* * * * *